United States Patent
Mulder et al.

(10) Patent No.: US 8,194,231 B2
(45) Date of Patent: Jun. 5, 2012

(54) LITHOGRAPHIC APPARATUS AND METHOD

(75) Inventors: Heine Melle Mulder, Veldhoven (NL); Joost Cyrillus Lambert Hageman, Eindhoven (NL); Roland Johannes Wilhelmus Stas, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 792 days.

(21) Appl. No.: 12/241,790

(22) Filed: Sep. 30, 2008

(65) Prior Publication Data

US 2009/0109415 A1    Apr. 30, 2009

Related U.S. Application Data

(60) Provisional application No. 60/976,989, filed on Oct. 2, 2007.

(51) Int. Cl.
*G03B 27/54* (2006.01)
*G03B 27/68* (2006.01)
*G03B 27/42* (2006.01)

(52) U.S. Cl. ............................... 355/67; 355/52; 355/53

(58) Field of Classification Search .................... 355/52, 355/53, 55, 67, 71
See application file for complete search history.

(56) References Cited

U.S. PATENT DOCUMENTS

| | | | |
|---|---|---|---|
| 6,107,013 A | 8/2000 | Fujisawa et al. | |
| 6,252,651 B1 | 6/2001 | Fujisawa et al. | |
| 6,982,786 B2 | 1/2006 | Shiode | |
| 7,221,431 B2 | 5/2007 | Ohsaki | |
| 7,468,781 B2 * | 12/2008 | Shiozawa | 355/67 |
| 7,538,854 B2 * | 5/2009 | Ohsaki | 355/55 |
| 7,684,013 B2 | 3/2010 | Hansen et al. | |
| 2003/0197865 A1 | 10/2003 | Shiode | |
| 2005/0146693 A1 | 7/2005 | Ohsaki | |
| 2006/0170891 A1 | 8/2006 | Nishinaga et al. | |
| 2006/0181690 A1 | 8/2006 | Nishinaga et al. | |
| 2007/0002300 A1 * | 1/2007 | Hansen et al. | 355/67 |

FOREIGN PATENT DOCUMENTS

| | | |
|---|---|---|
| JP | 5-67557 | 3/1993 |
| JP | 10-233361 | 9/1998 |
| JP | 2005-175034 | 6/2005 |
| JP | 2005-268744 | 9/2005 |
| JP | 2006-324664 | 11/2006 |
| WO | 03/088329 | 10/2003 |

OTHER PUBLICATIONS

Japanese Office Action mailed Feb. 4, 2011 in corresponding Japanese patent application No. 2008-256061.

* cited by examiner

*Primary Examiner* — Hung Henry Nguyen
(74) *Attorney, Agent, or Firm* — Pillsbury Winthrop Shaw Pittman LLP (57) ABSTRACT

A lithographic apparatus includes an illumination system configured to condition a beam of radiation, a support structure configured to hold a reticle, a substrate table configured to hold a substrate, and a projection system configured to project a beam onto the substrate table. The numerical aperture of the illumination system is larger than the numerical aperture of the projection system. The apparatus also includes a radiation redirection device configured to re-direct σ>1 components of the beam of radiation to within the numerical aperture of the projection system.

24 Claims, 7 Drawing Sheets

LITHOGRAPHIC APPARATUS AND METHOD

This application claims priority and benefit under 35 U.S.C. §119(e) to U.S. Provisional Patent Application No. 60/976,989, filed Oct. 2, 2007, the foregoing application incorporated herein in its entirety by reference.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

Known lithographic apparatuses have an illumination system which provides imaging offering $\sigma<1$, wherein $\sigma$ is a ratio between the numerical aperture of the illumination system that illuminates the patterning device pattern with the beam of radiation, and the numerical aperture of a projection system that projects the image of the patterning device pattern onto the resist layer.

The illumination system has a pupil, which is a Fourier transform of the object plane in which the patterning device of the lithographic apparatus is located. The pupil plane of the illumination system is conjugate to a pupil plane of the projection system. An illumination mode can be described by reference to the spatial distribution of intensity of a radiation beam in the pupil plane of the illumination system. It will be understood that the spatial distribution of intensity in the pupil plane of the projection system will be generally the same as the distribution of intensity in the pupil plane of the illumination system, subject to diffraction effects which may be caused by a pattern of the patterning device.

SUMMARY

It is desirable, for example, for there to be a mechanism and method to allow measurement of the pupil of an illumination system providing imaging with $\sigma>1$.

According to an aspect of the present invention, there is provided a lithographic apparatus comprising: an illumination system configured to condition a beam of radiation; a support structure configured to hold a reticle, the reticle having a pinhole; a substrate table configured to hold a substrate; a projection system configured to project a beam onto the substrate table, wherein the numerical aperture of the illumination system is larger than the numerical aperture of the projection system; and a radiation redirection device configured to re-direct $\sigma>1$ components of the beam of radiation to within the numerical aperture of the projection system.

According to an aspect of the present invention, there is provided a method comprising: providing a beam of radiation using an illumination system; projecting the beam of radiation through a projection system, wherein the numerical aperture of the projection system is equal to or less than the numerical aperture of the illumination system; positioning a reticle, having a pinhole, between the illumination system and the projection system; and redirecting radiation such that $\sigma>1$ components of the beam of radiation are able to pass within the numerical aperture of the projection system.

The method may further comprise using a sensor to sense the projection system pupil, communicating the sensed pupil to a processor, and using the processor to reconstruct a representation of the pupil of the illumination system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein the substrate is immersed in a liquid having a relatively high refractive index, e.g. water, so as to fill a space between the final element of the projection system and the substrate. An immersion liquid may be applied to other spaces in the lithographic apparatus, for example, between the mask and the first element of the projection system. Immersion techniques are well known in the art for increasing the numerical aperture of projection systems.

Figure 1:
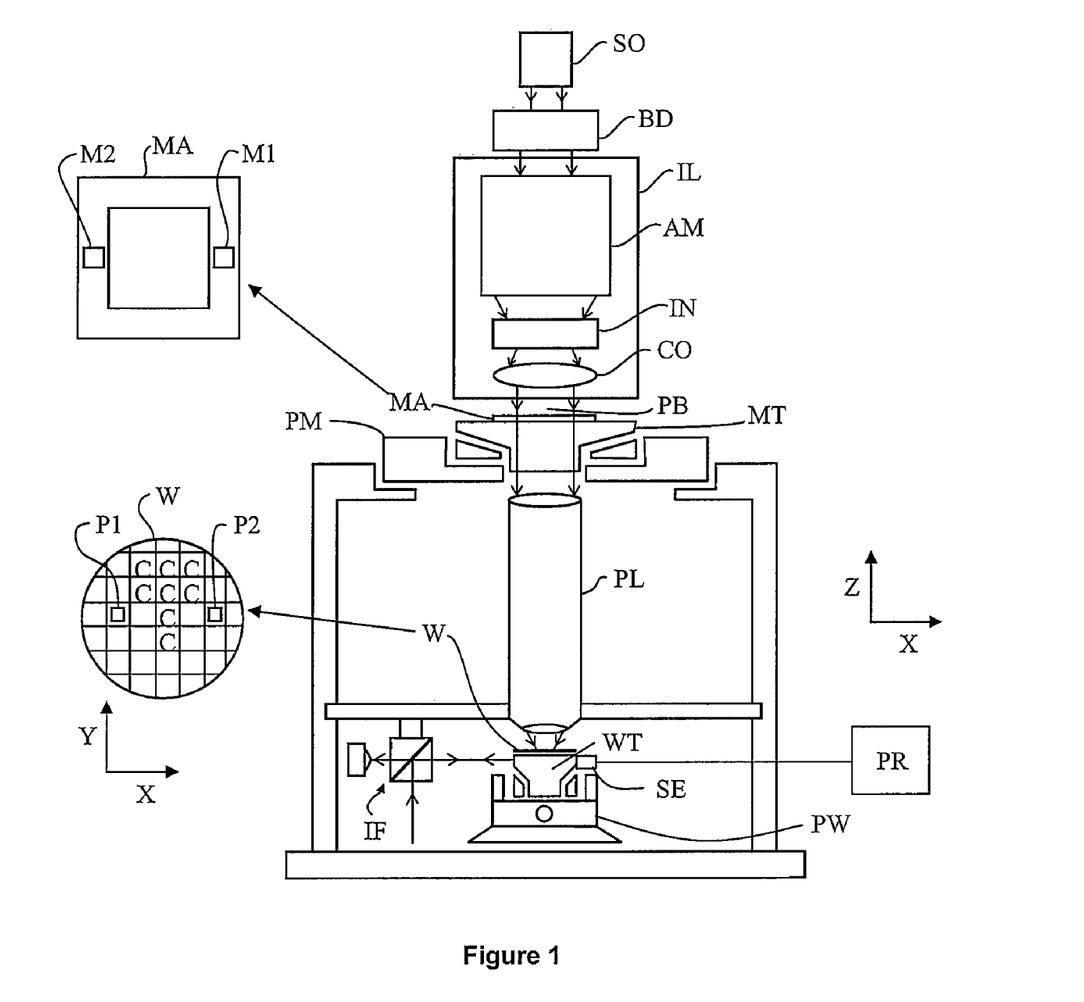
FIG. 1 depicts a lithographic apparatus according to an embodiment of the invention.

FIG. 1 schematically depicts a lithographic apparatus according to a particular embodiment of the invention. The apparatus comprises:
- an illumination system (illuminator) IL to condition a beam PB of radiation (e.g. UV radiation);
- a support structure (e.g. a mask table) MT to support a patterning device (e.g. a mask) MA and connected to first positioning device PM to accurately position the patterning device with respect to item PL;
- a substrate table (e.g. a wafer table) WT to hold a substrate (e.g. a resist-coated wafer) W and connected to second positioning device PW to accurately position the substrate with respect to item PL; and
- a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section.

The radiation beam PB is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

For imaging offering $\sigma<1$, a property of the pupil formed by a projection system on a substrate may be measured using a pinhole reticle and a sensor positioned in front or behind the image plane in a substrate table. Similarly, a property of the pupil of an illumination system projected by a $\sigma<1$ system may be measured using a pinhole reticle and a sensor positioned in front or behind the image plane.

It can be advantageous and desirable to use imaging which offers $\sigma>1$. For example, dark field imaging may improve the resolution, the Mask Error Enhancement Factor (MEEF) and the proximity bias effects of lithographic apparatus. Such imaging which offers $\sigma>1$ uses illumination originating from regions in the pupil of the illumination system corresponding to regions outside the numerical aperture of the projection system, i.e. originating from points in the illumination pupil with a normalized radial coordinate $\sigma>1$.

The maximum numerical aperture of illumination radiation is defined by:

$$NA_{ill} = \sigma_{out\,max} \cdot NA_{proj}$$

wherein $NA_{ill}$ is the numerical aperture of the illumination system and $NA_{proj}$ is the numerical aperture of the projection system. However, the projection system may include some demagnification, $Mag_{proj}$. For example, for a $Mag_{proj}=0.25$, the NA at patterning device level is ¼ of the NA at substrate level.

A system providing imaging offering $\sigma>1$ such as, for example, a system suitable to provide dark field illumination, is characterized by $NA_{ill\,max}>NA_{proj}$. That is, the numerical aperture $NA_{proj}$ of the projection system is smaller than the numerical aperture $NA_{ill\,max}$ of the illumination system. The $\sigma>1$ components of illumination are offered at the patterning device level at angles which are unable to pass the numerical aperture and consequently cannot be measured in the same way as $\sigma<1$ components, i.e. using a pinhole reticle and a sensor positioned in the substrate table.

Figure 2A:
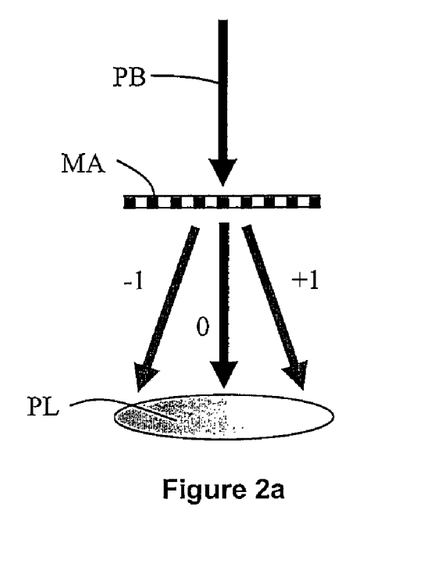
FIGS. 2a, 2b and 2c are schematic drawings showing the diffraction orders collected by the projection system.

Referring to FIG. 2a in combination with FIG. 1, the illuminator IL provides a radiation beam PB which illuminates a patterning device MA along the optical axis of the projection system PL. The beam PB is diffracted at angles (or n diffraction orders) by the patterning device MA in accordance with the spatial frequency components of the pattern of the patterning device. In FIG. 2a the zero order and +/−1 orders of the diffracted beam are shown being projected into the projection system PL. However, as will be appreciated, in practice there are an infinite number of orders of the diffracted beam.

Figure 2B:
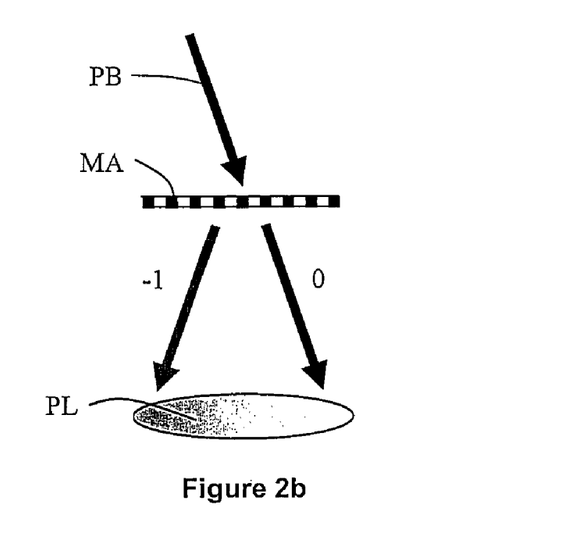

Referring to FIG. 2b, resolution and depth of focus can be improved where the axis of illumination (i.e. axis of the beam PB) is not parallel with the optical axis of the projection system PL such that the zero-order and −1 order radiation is projected towards the peripheral regions of the projection system PL. This is known as off-axis illumination.

Figure 2C:
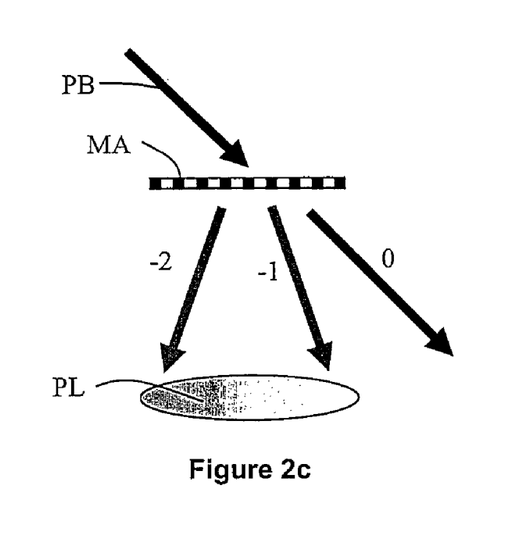

Referring to FIG. 2c, where the axis of illumination is even more acute relative to the patterning device the zero order radiation is projected outside the image plane, such that only the higher order, in this example the −1 and −2 orders, radiation is able to be collected by the projection system PL. The zero-order is not collected as it is projected outside the numerical aperture, therefore $\sigma>1$. This is known as dark field imaging.

An embodiment of the present invention is concerned with measuring one or more properties of the pupil of the illumination system for imaging systems where $\sigma>1$.

Figure 3:
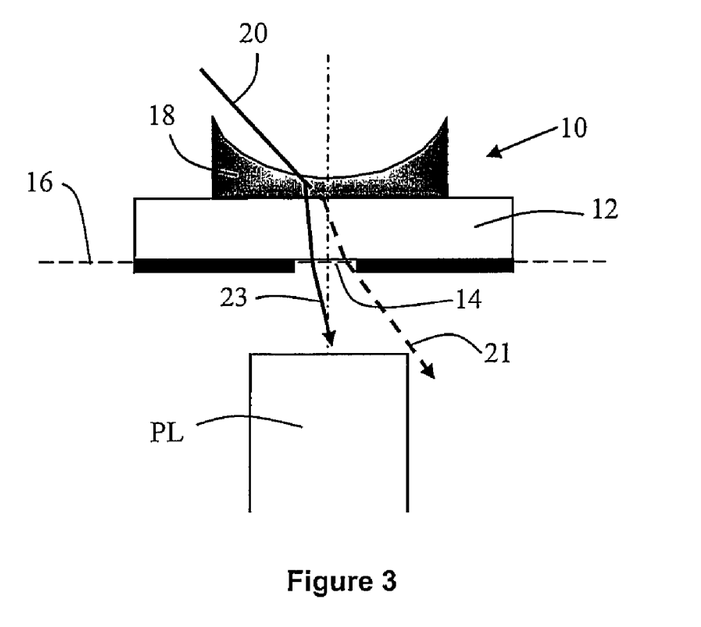
FIG. 3 is a schematic drawing of an apparatus according to an embodiment of the invention.

Referring to FIG. 3, apparatus 10, according to an embodiment of the invention, configured to measure one or more properties of the illumination system pupil is shown. The apparatus 10 comprises a reticle 12 having a pinhole 14. In use, the pinhole 14 is positioned in the object plane 16 of the projection system. The apparatus 10 further comprises a negative lens 18 (such as a plano-concave lens or a double concave lens), disposed above the reticle 12. Referring also to FIG. 1, in use, in order to measure the illumination system pupil, the pinhole reticle 12 is placed on the support structure MT used to hold the patterning device MA. It will be appreciated that although this embodiment is described in relation to a single pinhole and associated negative lens, the apparatus may comprise a plurality of such pinholes and associated negative lenses.

In use, a beam 20, illuminates the pinhole reticle 12, through the lens 18. The beam is incident on the lens 18. The beam 20 is refracted by the lens 18 such that components of the illumination system pupil which would normally be projected outside the numerical aperture of the projection system PL as indicated by 21 are redirected such that they are projected within the boundary of the numerical aperture of the projection system PL, as indicated by 23, and are thereby able to be captured by the projection system PL. Therefore, in other words, the lens 18 is operable as a radiation ray redirector which redirects radiation rays, which would otherwise be projected outside the numerical aperture, such that they are projected within the boundary of the numerical aperture for collection by the projection system PL.

The pupil of the projection system PL contains the σ<1 and σ>1 components of the beam and one or more properties thereof are collected in the form of an image using a sensor in the substrate table WT. The image is then processed, whereby the function of the lens 18 is reversed and an image of the illumination system pupil including the σ>1 components is reconstructed from which one or more properties of the illumination pupil can be determined. This is desirably carried out using a sensor SE positioned in the substrate table WT, which senses the pupil of the projected radiation beam. The sensed pupil is electronically communicated to a processor PR which reconstructs a representation of the illumination system pupil including the σ>1 components from which one or more properties of the illumination system pupil can be determined. The positions of the sensor SE and processor PR are shown in FIG. 1.

Figure 4A:
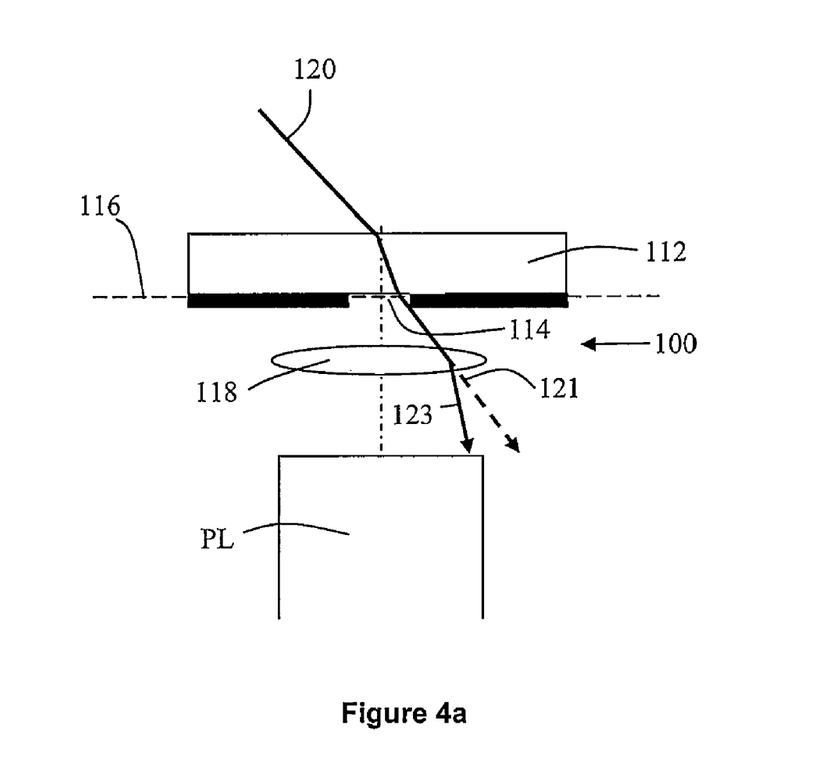
FIGS. 4a and 4b are schematic drawings of an apparatus according to an embodiment of the invention.

Referring to FIG. 4a, apparatus 100, according to an embodiment of the invention, is depicted. Apparatus 100 has a reticle 112 having a pinhole 114. The pinhole 114 is positioned on the object plane 116 of the projection system PL. Referring also to FIG. 1, in order to measure the illumination system pupil, the pinhole reticle 112 is placed on the support structure MT. A positive lens 118 is disposed below the reticle 112 and spaced apart therefrom such that, in use, the radiation rays pass through the peripheral regions of the lens 118. This is advantageous otherwise the radiation rays would pass through the center of the lens 118 and the lens would have no effect on them. The lens 118 should be spaced apart from the reticle 112 by no more than 5 mm.

Figure 4B:
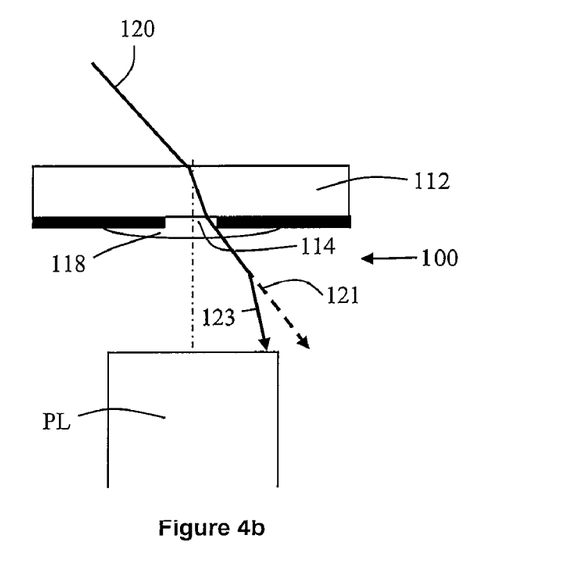

FIG. 4b shows an arrangement of the embodiment of apparatus 100, wherein the lens 118 is not spaced apart from the reticle 112 but instead forms part of the reticle 112.

It will be appreciated that although this embodiment is described in relation to a single pinhole and associated positive lens, the apparatus may comprise a plurality of such pinholes and associated positive lenses.

In use, a beam 120, illuminates the pinhole reticle 112. The beam 120 is incident on the reticle 112 and rays thereof project through the pinhole 114 into the lens 118.

As they travel through the lens 118 the radiation rays are refracted such that components of the illumination system pupil which would normally be projected outside the numerical aperture of the projection system PL as indicated by 121 are redirected such that they are projected within the boundary of the numerical aperture of the projection system PL, as indicated by 123, and are thereby able to be captured by the projection system PL. Therefore, in other words, the lens 118 is operable as a radiation ray redirector which redirects radiation rays, which would otherwise be projected outside the numerical aperture, such that they are projected within the boundary of the numerical aperture for collection by the projection system PL.

The pupil of the projection system PL contains the σ<1 and σ>1 components of the beam and one or more properties thereof are collected in the form of an image using a sensor in the substrate table WT. The image is then processed, whereby the function of the lens 118 is reversed and an image of the illumination pupil including the σ>1 components is reconstructed from which one or more properties of the illumination pupil can be determined. This is desirably carried out using a sensor SE positioned in the substrate table WT, which senses the pupil of the projected radiation beam. The sensed pupil is electronically communicated to a processor PR which reconstructs a representation of the illumination system pupil including the σ>1 components from which one or more properties of the illumination system pupil can be determined. The positions of the sensor SE and processor PR are shown in FIG. 1.

Figure 5:
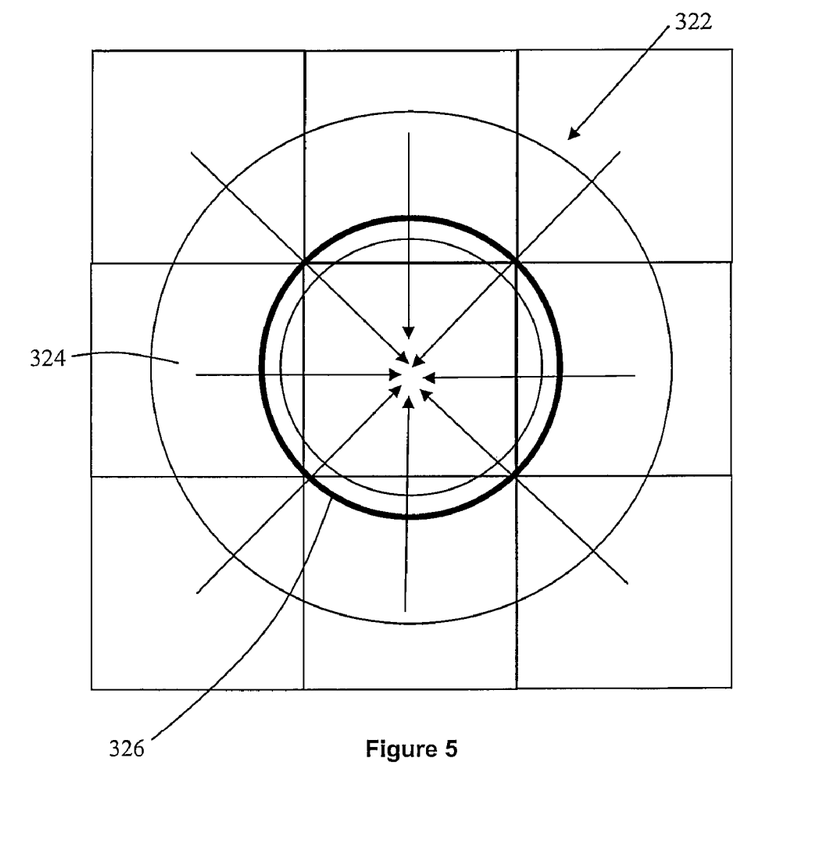
FIG. 5 is a schematic drawing of an aerial view of an illumination system pupil having $\sigma>1$ components.

Referring to FIG. 5, an aerial view of a pupil 322 of the illumination system having σ>1 components is shown. The σ>1 components account for the annular shaded region 324 which extends radially outwards beyond the numerical aperture boundary 326. In order for a true representation of the illumination system pupil 322 (including the σ>1 components) to be accepted into the projection system PL (see FIG. 1) the σ>1 components are shifted into the region radially inwards of the numerical aperture boundary 326. As discussed above, this may be done using lenses 18, 118.

Figure 6:
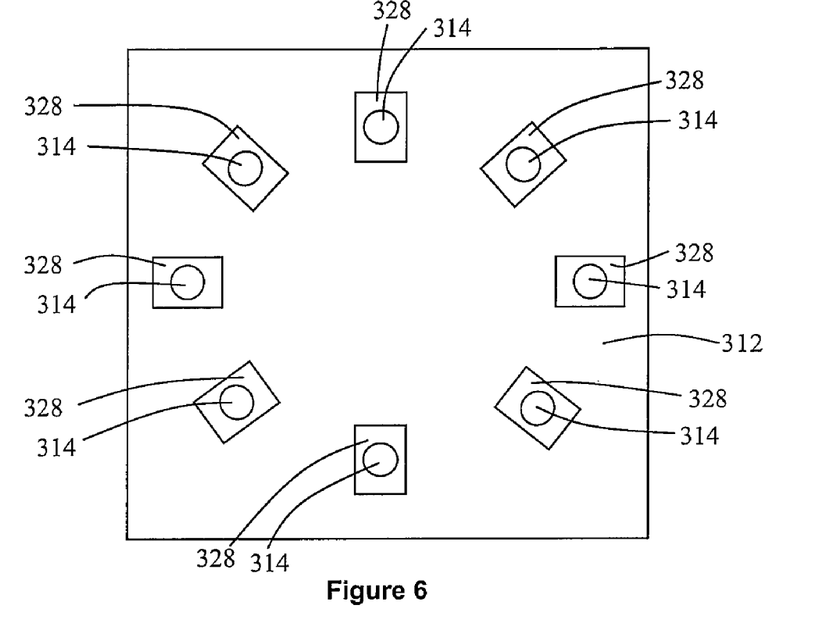
FIG. 6 is a schematic drawing of an aerial view of an apparatus according to an embodiment of the invention.
Figure 7:
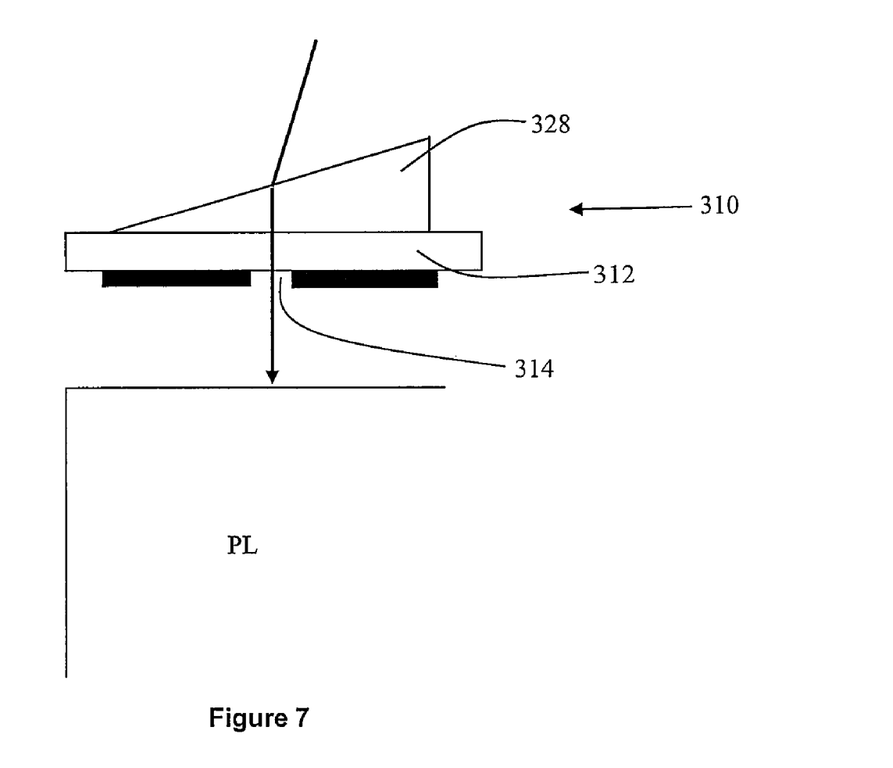
FIG. 7 is a schematic elevation drawing of the apparatus of FIG. 6.

Referring to FIGS. 6 and 7, an apparatus 310, according to an embodiment of the invention, is shown. The apparatus 310 comprises a reticle 312 having eight pinholes 314. Each pinhole 314 represents an equal segment of the annular shaded area of the illumination system pupil 322 representing components of the beam as shown in FIG. 5. The apparatus 310 further comprises eight optical wedges 328, each wedge corresponding to one of the pinholes 314. For the benefit of simplicity only one of the pinholes 314 and associated wedges 328 is shown in FIG. 7. However, it will be appreciated that each of the other pinholes and wedges function in a similar manner.

In use, each segment representing a component of the beam is shifted radially inward by refraction of the beam through the respective wedge 328 and through the respective pinhole 314 such that the σ>1 components of the beam are accepted within the numerical aperture of the projection system PL, i.e. geometric telecentricity is applied to the illumination system pupil.

In the same manner as described above with respect to FIGS. 3 and 4, the pupil of the projection system PL contains the σ<1 and σ>1 components of the beam and one or more properties thereof are collected in the form of an image using a sensor in the substrate table WT. The image is then processed, whereby the geometric telecentricity is reversed and an image of the illumination pupil including the σ>1 components is reconstructed from which one or more properties of the illumination pupil can be determined. This is desirably carried out using a sensor SE positioned in the substrate table WT, which senses the pupil of the projected radiation beam. The sensed pupil is electronically communicated to a processor PR which reconstructs a representation of the illumination system pupil including the σ>1 components from which one or more properties of the illumination system pupil can be determined. The positions of the sensor SE and processor PR are shown in FIG. 1.

Figure 8:
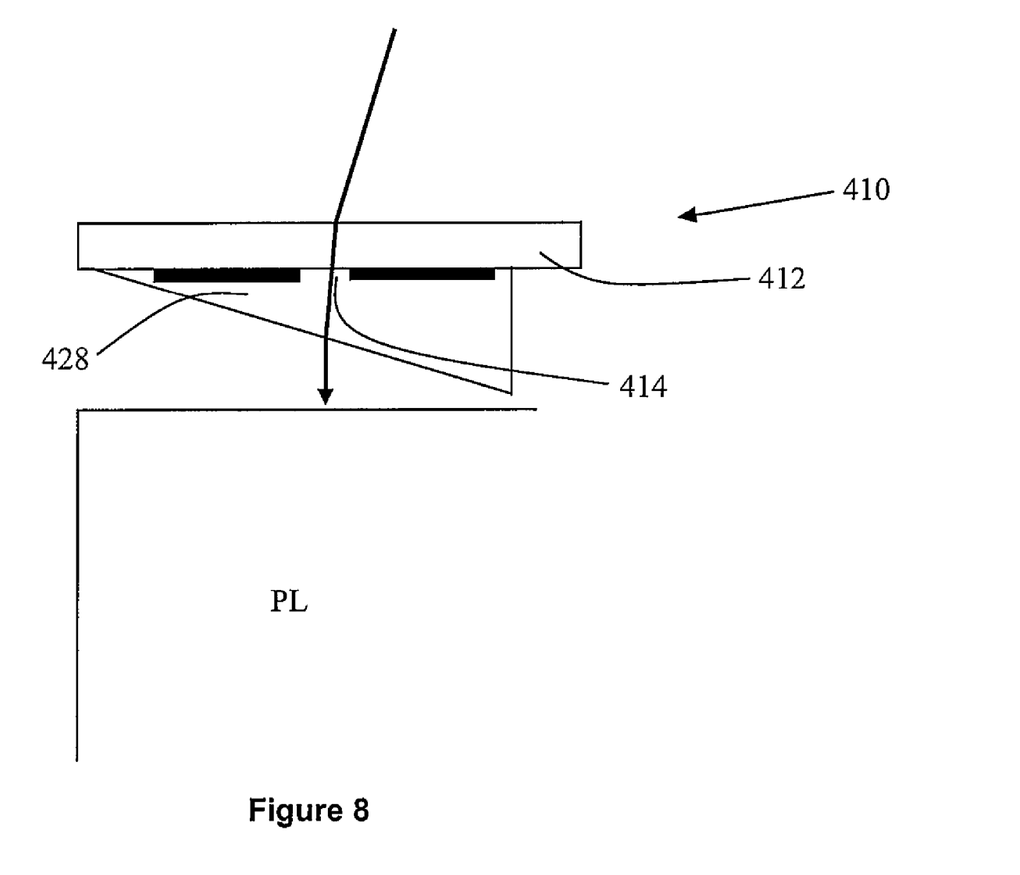
FIG. 8 is a schematic drawing of an apparatus according to an embodiment of the invention.

Referring to FIG. 8, an apparatus 410, according to an embodiment of the invention, is shown. Apparatus 410 is a variation of apparatus 310 wherein the wedges are disposed on the underside of the reticle 412. In this embodiment the geometric telecentricity is applied to rays below the pinhole 414. The illumination system pupil is reconstructed using a sensor in the substrate table WT as described in the preceding paragraph in relation to apparatus 310.

Figure 9:
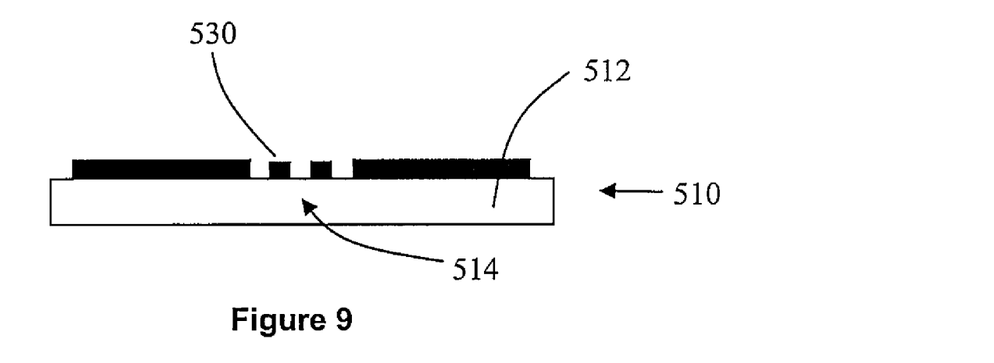
FIG. 9 is a schematic drawing of an apparatus according to an embodiment of the invention.
Figure 10:
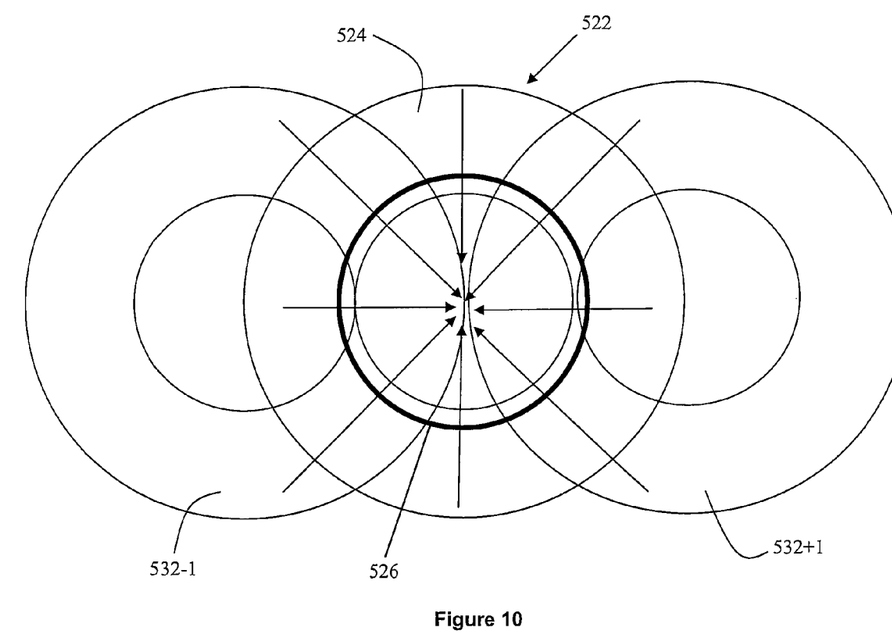
FIG. 10 is a schematic drawing of an aerial view of a pupil having $\sigma>1$ components.

Referring to FIG. 9, apparatus 510, according to an embodiment of the invention, is depicted. Apparatus 510 comprises a reticle 512 having a pinhole 514. The apparatus 510 further comprises a diffractive grating 530 which is positioned to cover the pinhole 514. FIG. 10 shows an aerial view of an illumination system pupil 522 having σ>1 components. The σ>1 components account for the annular shaded region 524 which extends radially outwards beyond the numerical aperture boundary 526. In order for a representation of the illumination system pupil 522 (including the σ>1 components) to be accepted into the projection system PL (see FIG. 1) the σ>1 components should be shifted into the region radially inwards of the numerical aperture boundary 526.

In use, the grating 530 is oriented such that first order $532_{+1}$ and $532_{-1}$ of the beam incident thereon is shifted radially inwards within the numerical aperture boundary 526. The grating 530 is then successively rotated, relative to the axis of the radiation beam, wherein for each angle of orientation the order is shifted inwards within the numerical aperture boundary 526, such that the σ>1 components are able to pass through the numerical aperture of the projection system PL.

In addition to or alternatively to having a grating 530 which is capable of being successively rotated, the reticle 512 may have a plurality of pinholes 514, each pinhole having a grating 530 oriented differently such that each of the desired angles of orientation can be achieved.

As previously discussed, the pupil of the projection system PL contains the σ<1 and σ>1 components of the beam and one or more properties thereof are collected in the form of an image using a sensor in the substrate table WT. The image is then processed, whereby an image of the illumination system pupil including the σ>1 components is reconstructed from which one or more properties of the illumination pupil can be determined. This is desirably carried out using a sensor SE positioned in the substrate table WT, which senses the pupil of the projected radiation beam. The sensed pupil is electronically communicated to a processor PR which reconstructs a representation of the illumination system pupil including the σ>1 components from which one or more properties of the illumination system pupil can be determined. The positions of the sensor SE and processor PR are shown in FIG. 1.

Figure 11:
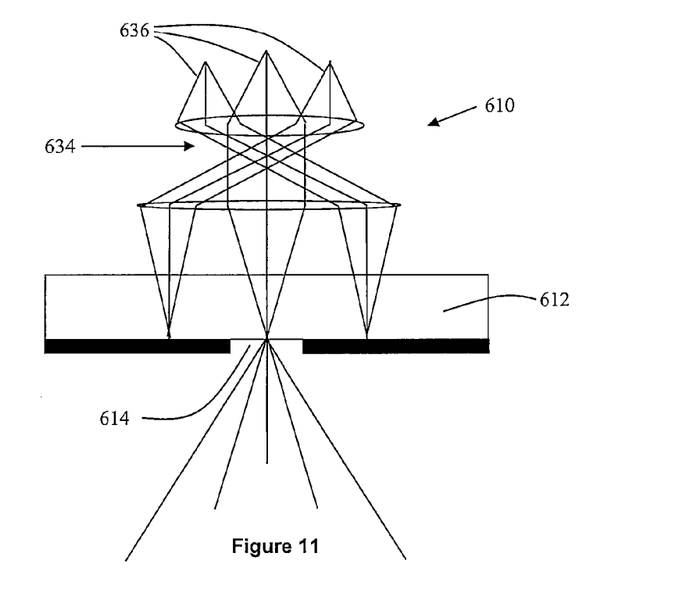
FIG. 11 is a schematic drawing of an apparatus according to an embodiment of the invention.

Referring to FIG. 11, an apparatus 610, according to an embodiment of the invention, is shown. Apparatus 610 comprises a reticle 612 having a pinhole 614 and magnifying optics 634 positioned above the pinhole 614. The magnifying optics 614 are positioned to reduce the angles of the radiation rays 636 (derived from the beam) such that they are within the numerical aperture boundary of the projection system PL and are therefore able to pass therethrough. Consequently, σ<1 and σ>1 components of the beam are able to contribute to the projection process.

It will be appreciated that although this embodiment is described in relation to a single pinhole and associated magnifying optics, the apparatus may alternatively comprise a plurality of such pinholes and associated magnifying optics.

The magnified pupil of the projection system PL is corrected such that an image of the illumination system pupil including the σ>1 components is reconstructed, from which one or more properties of the illumination system pupil can be determined. This is desirably carried out using a sensor SE positioned in the substrate table WT, which senses the pupil of the projected radiation beam. The sensed pupil is electronically communicated to a processor PR which reconstructs a representation of the illumination system pupil including the σ>1 components from which one or more properties of the illumination system pupil can be determined. The positions of the sensor SE and processor PR are shown in FIG. 1.

In the illustrated embodiments of the invention, the sensor SE is shown in FIG. 1 as being provided as part of the substrate table. However, it is not essential that the sensor SE is provided in the substrate table. It may be provided in any other suitable location, for example in an independently moveable actuator provided in the lithographic apparatus.

One or more aspects of one or more embodiments herein may be, where appropriate, combined with, added to or substituted for one or more aspects of one or more other embodiments. While specific embodiments of the invention have been described above, it will be appreciated that the invention may be practiced otherwise than as described. The description is not intended to limit the invention.

The invention claimed is:
1. A lithographic apparatus comprising:
an illumination system configured to condition a beam of radiation;
a support structure configured to hold a reticle, the reticle having a pinhole;
a substrate table configured to hold a substrate;
a projection system configured to project a beam onto the substrate table, wherein the numerical aperture of the illumination system is larger than the numerical aperture of the projection system; and
a radiation redirection device located or locatable in a path of the beam of radiation at a position at or upstream of an entrance of the beam of radiation to the projection system, the radiation redirection device configured to redirect σ>1 components of the beam of radiation to within the numerical aperture of the projection system.

2. The apparatus of claim 1, wherein the reticle is positioned between the illumination system and the projection system.

3. The apparatus of claim 2, wherein the radiation redirection device comprises a negative lens positioned to overlie the pinhole.

4. The apparatus of claim 2, wherein the negative lens is attached to the reticle.

5. The apparatus of claim 2, wherein the radiation redirection device comprises a positive lens positioned to underlie the pinhole.

6. The apparatus of claim 2, wherein the reticle has more than one pinhole and the radiation redirection device comprises a transmissive wedge to redirect the σ>1 components of the beam of radiation to within the numerical aperture of the projection system.

7. The apparatus of claim 6, wherein the transmissive wedge is positioned to overlie an associated pinhole.

8. The apparatus of claim 7, wherein the transmissive wedge is positioned to underlie an associated pinhole.

9. The apparatus of claim 2, wherein the radiation redirection device comprises a diffractive grating.

10. The apparatus of claim 9, wherein the reticle comprises a plurality of pinholes, each pinhole having an associated diffractive grating, wherein one or more of the diffractive gratings are positioned in a different orientation relative to the other diffractive gratings.

11. The apparatus of claim 9, wherein the diffractive grating is positioned to cover the pinhole.

12. The apparatus of claim 10, wherein the diffractive grating is rotatable relative to an axis of the beam of radiation.

13. The apparatus of claim 11, wherein the reticle comprises a plurality of pinholes, each pinhole having an associated diffractive grating, wherein one or more of the diffractive gratings are positioned in a different orientation relative to the other diffractive gratings.

14. The apparatus of claim 2, comprising a magnifier disposed to overlie the pinhole.

15. The apparatus of claim 1, further comprising a sensor located after the projection system and a processor, the sensor being arranged to sense a projection system pupil and communicate the projection system pupil to the processor, the processor being arranged to reconstruct a representation of the illumination system pupil.

16. A method comprising:
   providing a beam of radiation using an illumination system;
   projecting the beam of radiation through a projection system, wherein the numerical aperture of the projection system is equal to or less than the numerical aperture of the illumination system;
   positioning a reticle, having a pinhole, between the illumination system and the projection system; and
   redirecting radiation, prior to or as the radiation enters the projection system, such that $\sigma>1$ components of the beam of radiation are able to pass within the numerical aperture of the projection system.

17. The method of claim 16, comprising redirecting radiation using a negative lens overlying the pinhole.

18. The method of claim 16, comprising redirecting radiation using a positive lens underlying the pinhole.

19. The method of claim 16, wherein the reticle has more than one pinhole and comprising redirecting radiation using a transmissive wedge suitably positioned to redirect the $\sigma>1$ components of the beam of radiation to within the numerical aperture of the projection system.

20. The method of claim 19, wherein the transmissive wedge overlies an associated pinhole.

21. The method of claim 16, comprising redirecting radiation using a diffractive grating suitably positioned to redirect the $\sigma>1$ components of the beam of radiation to within the numerical aperture of the projection system.

22. The method of claim 21, comprising successively rotating the diffractive grating relative to an axis of the radiation beam, wherein for each angle of orientation a diffraction order of the radiation beam is shifted inwards within the numerical aperture boundary such that $\sigma>1$ components of the beam of radiation are able to pass through the numerical aperture of the projection system.

23. The method of claim 16, wherein redirecting radiation comprises magnifying.

24. The method of claim 16, comprising using a sensor to sense the pupil of the radiation beam, communicating the sensed pupil to a processor, and using the processor to reconstruct a representation of the illumination system pupil.

* * * * *